(12) United States Patent
Jeong et al.

(10) Patent No.: US 8,519,734 B2
(45) Date of Patent: Aug. 27, 2013

(54) SEMICONDUCTOR APPARATUS, METHOD FOR ASSIGNING CHIP IDS THEREIN, AND METHOD FOR SETTING CHIP IDS THEREOF

(75) Inventors: Chun Seok Jeong, Ichon-shi (KR); Jae Jin Lee, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 182 days.

(21) Appl. No.: 13/162,676

(22) Filed: Jun. 17, 2011

(65) Prior Publication Data

US 2012/0182042 A1    Jul. 19, 2012

(30) Foreign Application Priority Data

Jan. 14, 2011    (KR) .................. 10-2011-0004036

(51) Int. Cl.
*H03K 19/003*    (2006.01)

(52) U.S. Cl.
USPC ............................................. 326/9

(58) Field of Classification Search
None
See application file for complete search history.

(56) References Cited

U.S. PATENT DOCUMENTS 7,916,511 B2    3/2011    Park

FOREIGN PATENT DOCUMENTS

| JP | 2003-110086 A | 4/2003 |
| JP | 2007157266 A | 6/2007 |
| KR | 100484077 B1 | 4/2005 |
| KR | 1020100040288 A | 4/2010 |

*Primary Examiner* — Crystal L Hammond
(74) *Attorney, Agent, or Firm* — William Park & Associates Patent Ltd.

(57) ABSTRACT

A semiconductor apparatus having first and second chips includes a first operation unit disposed in the first chip, and is configured to perform a predetermined arithmetic operation for an initial code according to a first repair signal and generate a first operation code; and a second operation unit disposed in the second chip, and configured to perform the predetermined arithmetic operation for the first operation code according to a second repair signal and generate a second operation code.

49 Claims, 3 Drawing Sheets

SEMICONDUCTOR APPARATUS, METHOD FOR ASSIGNING CHIP IDS THEREIN, AND METHOD FOR SETTING CHIP IDS THEREOF

CROSS-REFERENCES TO RELATED APPLICATION

The present application claims priority under 35 U.S.C. §119(a) to Korean Application No. 10-2011-0004036, filed on Jan. 14, 2011, in the Korean Intellectual Property Office, which is incorporated herein by reference in its entirety as if set forth in full.

BACKGROUND

1. Technical Field

Various embodiments of the present invention relates to a semiconductor apparatus and related methods. In particular, certain embodiments relate to a semiconductor apparatus including a plurality of chips using chip IDs.

2. Related Art

Recently, capacities and speeds of semiconductor memories, which are used as memory devices in most electronic systems, tend to be increased. Various attempts have been made to increase the capacity of memories within their narrower area while maintaining the driving efficiency thereof.

In order to improve the degree of integration of semiconductor memories, a three-dimensional (3D) layout, in which multiple memory chips are stacked, has been adopted in place of the existing two-dimensional (2D) layout. Since the industry needs higher degree of integration and higher capacity of semiconductor memories, it is expected that demand for a structure for increasing the capacity and decreasing the size of a semiconductor chip by using a 3D layout of memory chips will increase in the art.

A TSV (through-silicon via) scheme has been used as such a 3D layout structure. The TSV scheme has been adopted as an alternative to overcome reduction of a transmission speed due to a distance to a controller on a module, narrow data bandwidth, and reduction of a transmission speed due to varying conditions in a package. In the TSV type semiconductor, paths are defined to pass through a plurality of memory chips, and electrodes are formed in the paths so that respective memory chips and a controller can communicate with each other. In a stacked semiconductor memory apparatus to which the TSV scheme is applied, wires, sub packages and package balls, which are used in an SIP type and a POP type, are not needed, and direct connections to the controller are formed through vias. Bumps are formed between paths which pass through the plurality of memory chips, to electrically connect the respective memory chips with the controller.

In a semiconductor memory apparatus including a plurality of chips which adopt the TSV scheme, different chip IDs are assigned to the plurality of chips to allow selection of desired chips. The respective chip IDs are assigned to the plurality of chips, and a system including the semiconductor memory apparatus can select an intended chip in the semiconductor memory apparatus by inputting a chip selection code through a controller to the semiconductor memory apparatus. As a method for assigning the chip IDs to the plurality of chips, a recording operation such as fuse cutting is performed for a recording element for a one-time use. However, the recording operation such as the fuse cutting is difficult to be performed in a semiconductor memory apparatus in which stacking is implemented in the TSV, and requires substantial cost and time.

Further, in the semiconductor memory apparatus using the TSV scheme, a redundancy chip should be additionally disposed in order to prevent all the chips from becoming useless in case any one of the plurality of chips is failed.

SUMMARY

Accordingly, there is a need for an improved semiconductor apparatus including a plurality of chips using chip IDs which enables effective assignment of chip IDs to the respective individual chips.

To attain the advantages and in accordance with the purposes of the invention, as embodied and broadly described herein, one exemplary aspect of the present invention may provide a semiconductor apparatus having first and second chips which includes: a first operation unit disposed in the first chip, and configured to perform a predetermined arithmetic operation for an initial code according to a first repair signal and generate a first operation code; and a second operation unit disposed in the second chip, and configured to perform the predetermined arithmetic operation for the first operation code according to a second repair signal and generate a second operation code.

In another exemplary aspect of the present invention, a semiconductor apparatus having first and second chips may include: the first chip configured to receive an initial code and generate a first operation code; the second chip configured to receive the first operation code and generate a second operation code; a first chip ID selection unit disposed in the first chip, and configured to select the first operation code or a first predetermined code as a first chip ID according to a first repair signal; and a second chip ID selection unit disposed in the second chip, and configured to select the second operation code or a second predetermined code as a second chip ID according to a second repair signal.

In still another exemplary aspect of the present invention, a method for assigning chip IDs in a semiconductor apparatus having first and second chips may include: inputting an initial code to the first chip; generating a first operation code by performing a predetermined arithmetic operation for the initial code according to a first repair information in the first chip; assigning the first operation code or a first predetermined code as a first chip ID of the first chip according to the first repair information; generating a second operation code by performing the predetermined arithmetic operation for the first operation code according a second repair information in the second chip; and assigning the second operation code or a second predetermined code as a second chip ID of the second chip according to the second repair information.

In still another exemplary aspect of the present invention, a method for setting chip IDs of a semiconductor apparatus having first and second chips may include: assigning chip IDs for respective chips; determining whether or not the respective chips are normal or failed; recording repair information in the respective chips according to whether the respective chips are normal or failed; and substituting chip IDs of normal chips and failed chips.

In still another exemplary aspect of the present invention, a semiconductor apparatus may include: an operation unit configured to perform a predetermined arithmetic operation for an operation code according to a repair signal; and a chip ID assignment circuit including a chip ID selection unit configured to select the operation code or a predetermined code as a chip ID according to the repair signal.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION

Figure 1:
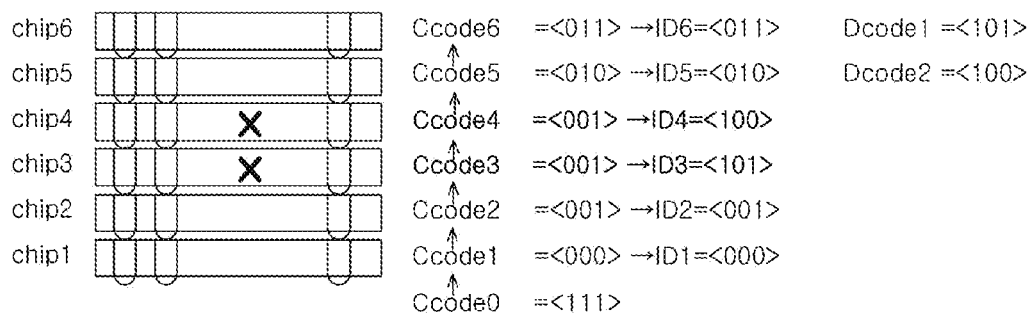
FIG. 1 is a schematic diagram showing a method for assigning chip IDs in a semiconductor apparatus in accordance with an embodiment of the present invention.

Reference will now be made in detail to the exemplary embodiments consistent with the present disclosure, examples of which are illustrated in the accompanying drawings. Wherever possible, the same reference characters will be used throughout the drawings to refer to the same or like parts.

In a semiconductor apparatus according to an exemplary embodiment of the present invention, each of at least some of a plurality of chips performs a predetermined arithmetic operation for an arithmetic operation code, such that different chip IDs can be easily assigned to the respective chips. Also, in the semiconductor apparatus according to the embodiment of the present invention, an operation code or a predetermined code is assigned as a chip ID depending upon a condition, such that desired chip IDs can be assigned to the respective chips.

FIG. 1 is a schematic diagram showing a method for assigning chip IDs in a semiconductor apparatus in accordance with an embodiment of the present invention.

In order to explain the method for assigning chip IDs in a semiconductor apparatus which is shown in FIG. 1, six memory chips are exemplarily used. The six memory chips comprise four normal chips chip1 through chip4 and two redundancy chips chip5 and chip6. It is to be noted that the scope of the present invention is not limited to the specific number of memory chips described herein.

The four normal chips chip1 through chip4 are configured for basic operations of memory chips, and the two redundancy chips chip5 and chip6 are extra chips provided in preparation for the occurrence of a fail in the normal chips chip1 through chip4. The six memory chips chip1 through chip6 are exemplified to be connected in a TSV (through-silicon via) scheme. However, the scope of the present invention is not necessarily limited to a particular type of the connection used for the respective chips.

Each of the six chips chip1 through chip6 may have repair information of corresponding chips. The scope of the present invention is not limited to a particular way of storing repair information, and, for example, the repair means may comprise storage elements such as electrical fuses, latch circuits and flip-flops. In the present exemplary embodiment, it is exemplified that the six chips chip1 through chip6 have electrical fuses (not shown) as the repair information for confirming whether or not the corresponding chips are normal or failed.

The method for assigning chip IDs, which is shown in FIG. 1, may be implemented through the steps of allowing the respective chips chip1 through chip6 to receive an operation code Ccode through a serial configuration, allowing the respective chips chip1 through chip6 to perform a predetermined arithmetic operation for the operation code Ccode based on the repair information, allowing the respective chips chip1 through chip6 to output the operation code Ccode through the serial configuration, and allowing the respective chips chip1 through chip6 to have the operation code Ccode or a predetermined code Dcode as the chip IDs of the respective chips chip1 through chip6 based on the repair information.

That is to say, the six chips chip1 through chip6 have serial input/output relationships with respect to the operation code Ccode. The six chips chip1 through chip6 receive the operation code Ccode from preceding chips, perform the predetermined arithmetic operation for the operation code Ccode, and output the operation code Ccode to next chips. Here, the predetermined arithmetic operation varies depending upon the repair information. The six chips chip1 through chip6 have the operation code Ccode or the predetermined code Dcode as the chip IDs based on the repair information.

Referring to FIG. 1, among the six chips chip1 through chip6, four chips chip1, chip2, chip5 and chip6 have the repair information (not marked) indicating normal chips, and two chips chip3 and chip4 have the repair information (marked with X) indicating failed chips. For the sake of easy explanation of the operation code Ccode of the respective chips, the operation code Ccode of the respective chips will be described by being divided into an initial code Ccode0 and first through sixth operation codes Ccode1 through Ccode6.

In FIG. 1, the predetermined arithmetic operation is exemplified as an arithmetic operation of adding 1 to the operation code if the repair information indicates a normal chip, and not adding 1 to the operation code if the repair information indicates a failed chip.

However, such an exemplification may be changed depending upon a particular configuration. For example, the predetermined arithmetic operation may be an increment operation for the operation code. In another example, the predetermined arithmetic operation may be a decrement operation for the operation code. In another example, the predetermined arithmetic operation may be an operation of subtracting 1 from the operation code. In the exemplary embodiment of the present invention, it is to be noted that the operation of adding 1 to the operation code is not intended to limit the present invention to the specific arithmetic operation.

In FIG. 1, the predetermined code Dcode is exemplified as having a first predetermined code Dcode1 and a second predetermined code Dcode2. Such an exemplification corresponds to a configuration in which the two chips chip5 and chip6 among the six chips chip1 through chip6 are redundancy chips. The first predetermined code Dcode1 is exemplified as <101> and the second predetermined code Dcode2 is exemplified as <100>.

The chip chip1 receives the initial code Ccode0. Since the chip chip1 has the repair information indicating a normal chip, the chip chip1 generates the first operation code Ccode1 by adding 1 to the initial code Ccode0. As shown in FIG. 1, the initial code Ccode0 is <111>, and, according to the predetermined arithmetic operation, the first operation code Ccode1 becomes <000>.

As the chip chip1 has the repair information indicating a normal chip, the chip chip1 has the first operation code Ccode1 as its chip ID ID1. That is, the chip ID ID1 of the chip chip1 is <000>.

As described above, the chips chip1 through chip6 have serial input/output relationships with respect to the operation code Ccode. The chip chip2 receives the first operation code Ccode1. Since the chip chip2 has the repair information indicating a normal chip, the chip chip2 generates the second operation code Ccode2 by adding 1 to the first operation code Ccode1. As can be seen from FIG. 1, the first operation code Ccode1 is <000>, and, according to the predetermined arithmetic operation, the second operation code Ccode2 becomes <001>.

As the chip chip2 has the repair information indicating a normal chip, the chip chip2 has the second operation code Ccode2 as its chip ID ID2. That is, the chip ID ID2 of the chip chip2 is <001>.

The chip chip3 receives the second operation code Ccode2. Since the chip chip3 has the repair information indicating a failed chip (marked with X in FIG. 1), the chip chip3 generates the third operation code Ccode3 by not adding 1 to the second operation code Ccode2. As can be seen from FIG. 1, the second operation code Ccode2 is <001>, and, according to the predetermined arithmetic operation, the third operation code Ccode3 becomes <001>.

As the chip chip3 has the repair information indicating a failed chip, the chip chip3 has not the third operation code Ccode3 but the first predetermined code Dcode1 as its chip ID ID3. That is, the chip ID ID3 of the chip chip3 is <101>.

The chip4 receives the third operation code Ccode3. Since the chip chip4 has the repair information indicating a failed chip (marked with X in FIG. 1), the chip chip4 generates the fourth operation code Ccode4 by not adding 1 to the third operation code Ccode3. As can be seen from FIG. 1, the third operation code Ccode3 is <001>, and, according to the predetermined arithmetic operation, the fourth operation code Ccode4 becomes <001>.

As the chip chip4 has the repair information indicating a failed chip, the chip chip4 has not the fourth operation code Ccode4 but the second predetermined code Dcode2 as its chip ID ID4. That is, the chip ID ID4 of the chip chip4 is <100>.

The chip chip5 receives the fourth operation code Ccode4. Since the chip chip5 has the repair information indicating a normal chip, the chip chip5 generates the fifth operation code Ccode5 by adding 1 to the fourth operation code Ccode4. As can be seen from FIG. 1, the fourth operation code Ccode4 is <001>, and, according to the predetermined arithmetic operation, the fifth operation code Ccode5 becomes <010>.

As the chip chip5 has the repair information indicating a normal chip, the chip chip5 has the fifth operation code Ccode5 as its chip ID ID5. That is, the chip ID ID5 of the chip chip5 is <010>.

The chip chip6 receives the fifth operation code Ccode5. Since the chip chip6 has the repair information indicating a normal chip, the chip chip6 generates the sixth operation code Ccode6 by adding 1 to the fifth operation code Ccode5. As can be seen from FIG. 1, the fifth operation code Ccode5 is <010>, and, according to the predetermined arithmetic operation, the sixth operation code Ccode6 becomes <011>.

As the chip chip6 has the repair information indicating a normal chip, the chip chip6 has the sixth operation code Ccode6 as its chip ID ID6. That is, the chip ID ID6 of the chip chip6 is <011>.

By the method for assigning chip IDs in a semiconductor apparatus in accordance with the embodiment of the present invention, the six chips chip1 through chip6 may be assigned with the different chip IDs ID1 through ID6. The chip IDs ID1, ID2, ID5 and ID6 of the chips chip1, chip2, chip5 and chip6 indicating normal chips have values of <000> to <011> that increase consecutively. Also, the chip IDs ID4 and ID3 of the chips chip4 and chip3 indicating failed chips have values of <100> and <101> that increase consecutively.

Due to this fact, in a system including the six chips chip1 through chip6 shown in FIG. 1, it is possible to select desired chips by changing the chip selection codes to <000>, <001>, <010> and <011>.

Figure 2:
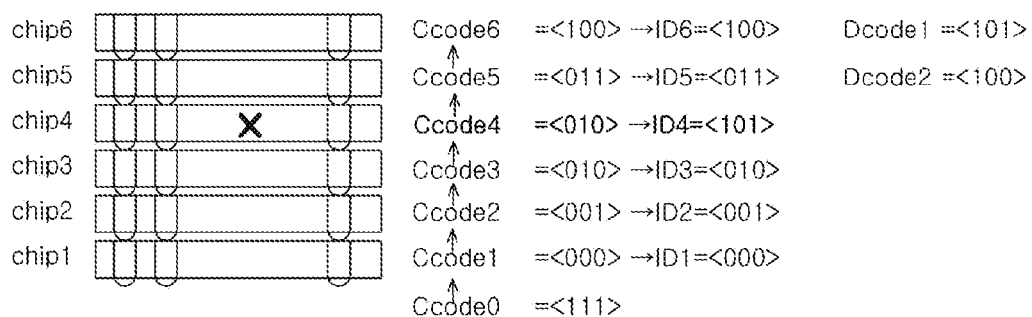
FIG. 2 is a schematic diagram showing another arithmetic operation in the method for assigning chip IDs in a semiconductor apparatus in accordance with the embodiment of the present invention.

FIG. 2 is a schematic diagram showing another arithmetic operation in the method for assigning chip IDs in a semiconductor apparatus in accordance with the embodiment of the present invention. FIG. 2 corresponds to a case in which one failed chip chip4 exists among the chips chip1 through chip6 shown in FIG. 1. In FIG. 2, the repair information of the failed chip chip4 is marked with X.

The chip chip1 receives the initial code Ccode0. Since the chip chip1 has the repair information indicating a normal chip, the chip chip1 generates the first operation code Ccode1 by adding 1 to the initial code Ccode0. As shown in FIG. 2, the initial code Ccode0 is <111>, and, according to the predetermined arithmetic operation, the first operation code Ccode1 becomes <000>.

As the chip chip1 has the repair information indicating a normal chip, the chip chip1 has the first operation code Ccode1 as its chip ID ID1. That is, the chip ID ID1 of the chip chip1 is <000>.

The chip chip2 receives the first operation code Ccode1. Since the chip chip2 has the repair information indicating a normal chip, the chip chip2 generates the second operation code Ccode2 by adding 1 to the first operation code Ccode1. As can be seen from FIG. 2, the first operation code Ccode1 is <000>, and, according to the predetermined arithmetic operation, the second operation code Ccode2 becomes <001>.

As the chip chip2 has the repair information indicating a normal chip, the chip chip2 has the second operation code Ccode2 as its chip ID ID2. That is, the chip ID ID2 of the chip chip2 is <001>.

The chip chip3 receives the second operation code Ccode2. Since the chip chip3 has the repair information indicating a normal chip, the chip chip3 generates the third operation code Ccode3 by adding 1 to the second operation code Ccode2. As can be seen from FIG. 2, the second operation code Ccode2 is <001>, and, according to the predetermined arithmetic operation, the third operation code Ccode3 becomes <010>.

As the chip chip3 has the repair information indicating a normal chip, the chip chip3 has the third operation code Ccode3 as its chip ID ID3. That is, the chip ID ID3 of the chip chip3 is <010>.

The chip chip4 receives the third operation code Ccode3. Since the chip chip4 has the repair information indicating a failed chip (marked with X in FIG. 2), the chip chip4 generates the fourth operation code Ccode4 by not adding 1 to the third operation code Ccode3. As can be seen from FIG. 2, the third operation code Ccode3 is <010>, and, according to the predetermined arithmetic operation, the fourth operation code Ccode4 becomes <010>.

As the chip chip4 has the repair information indicating a failed chip, the chip chip4 has not the fourth operation code Ccode4 but the first predetermined code Dcode1 as its chip ID ID4. That is, the chip ID ID4 of the chip chip4 is <101>.

The chip chip5 receives the fourth operation code Ccode4. Since the chip chip5 has the repair information indicating a normal chip, the chip chip5 generates the fifth operation code Ccode5 by adding 1 to the fourth operation code Ccode4. As can be seen from FIG. 2, the fourth operation code Ccode4 is <010>, and, according to the predetermined arithmetic operation, the fifth operation code Ccode5 becomes <011>.

As the chip chip5 has the repair information indicating a normal chip, the chip chip5 has the fifth operation code Ccode5 as its chip ID ID5. That is, the chip ID ID5 of the chip chip5 is <011>.

The chip chip6 receives the fifth operation code Ccode5. Since the chip chip6 has the repair information indicating a normal chip, the chip chip6 generates the sixth operation code Ccode6 by adding 1 to the fifth operation code Ccode5. As can be seen from FIG. 2, the fifth operation code Ccode5 is <011>, and, according to the predetermined arithmetic operation, the sixth operation code Ccode6 becomes <100>.

As the chip chip6 has the repair information indicating a normal chip, the chip chip6 has the sixth operation code Ccode6 as its chip ID ID6. That is, the chip ID ID6 of the chip chip6 is <100>.

By the method for assigning chip IDs in a semiconductor apparatus in accordance with the embodiment of the present invention, the six chips chip1 through chip6 may be assigned with the different chip IDs ID1 through ID6. The chip IDs ID1, ID2, ID3, ID5 and ID6 of the chips chip1, chip2, chip3, chip5 and chip6 indicating normal chips have values of <000> to <100> that increase consecutively. Also, the chip ID ID4 of the chip chip4 indicating a failed chip has a value of <101>.

Due to this fact, in a system including the six chips chip1 through chip6 shown in FIG. 2, it is possible to use four chips chip1, chip2, chip3 and chip5 with the chip IDs ID1, ID2, ID3 and ID5 of <000>, <001>, <010> and <011>, respectively, among the six chips chip1 through chip6, by changing the chip selection codes to <000>, <001>, <010> and <011>.

Also, in the six chips chip1 through chip6 shown in FIG. 2, since the chip6 as a redundancy chip with the repair information indicating a normal chip has the independent chip ID ID6 of <100>, in the system including the six chips chip1 through chip6, it is possible to use not the four chips chip1, chip2, chip3 and chip5 but the five chips chip1, chip2, chip3, chip5 and chip6 by changing the chip selection codes to <000>, <001>, <010>, <011> and <100>.

As shown in FIGS. 1 and 2, according to the setting of the first and second predetermined codes Dcode1 and Dcode2, the failed chips are configured to be assigned with the chip IDs that have values greater than those of the normal chips. For this setting, a greater value of the first and second predetermined codes Dcode1 and Dcode2 may be configured to be greater than or equal to a greatest value of the operation codes Code1 through Ccode6.

In another example, if the arithmetic operation is a decrement operation, a less value of the first and second predetermined codes Dcode1 and Dcode2 may be configured to be less than or equal to a least value of the operation codes Ccode1 through Ccode6.

Figure 3:
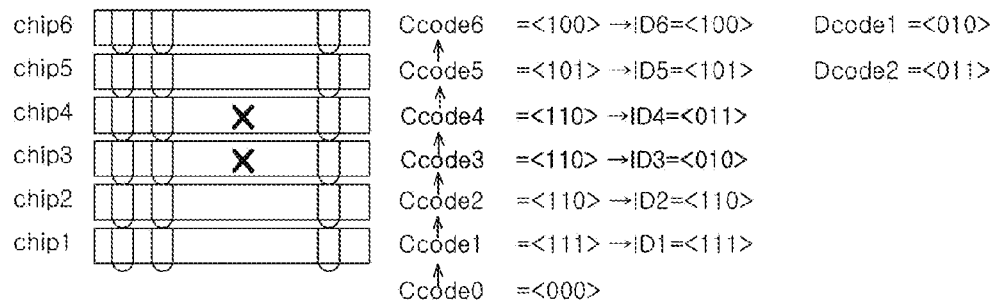
FIG. 3 is a schematic diagram showing a method for assigning chip IDs in a semiconductor apparatus in accordance with another embodiment of the present invention.

FIG. 3 is a schematic diagram showing a method for assigning chip IDs in a semiconductor apparatus in accordance with another embodiment of the present invention.

As described above, the predetermined arithmetic operation may be a decrement operation for the operation code. FIG. 3 exemplifies a case that the predetermined arithmetic operation is a decrement operation for the operation code, in particular, an operation of subtracting 1 from the operation code.

Also, as described above, if the arithmetic operation is a decrement operation, a less value of the first and second predetermined codes Dcode1 and Dcode2 may be configured to be less than or equal to a least value of the operation codes Ccode1 through Ccode6. As shown in FIG. 3, the first and second predetermined codes Dcode1 and Dcode2 may be set to <010> and <011>, respectively.

By the method for assigning chip IDs in a semiconductor apparatus shown in FIG. 3, the six chips chip1 through chip6 may be assigned with the different chip IDs ID1 through ID6. Chip IDs of normal chips among the six chips chip1 through chip6 have values that decrease consecutively from <111>. Also, chip IDs of failed chips among the six chips chip1 through chip6 have values that are less than those of the normal chips and consecutively decrease from <011>.

Since the method for assigning chip IDs in a semiconductor apparatus shown in FIG. 3 is distinguished from the method for assigning chip IDs in a semiconductor apparatus shown in FIGS. 1 and 2 only in terms of the contents of the predetermined arithmetic operation and is implemented with the same principle, detailed description thereof will be omitted herein.

Figure 4:
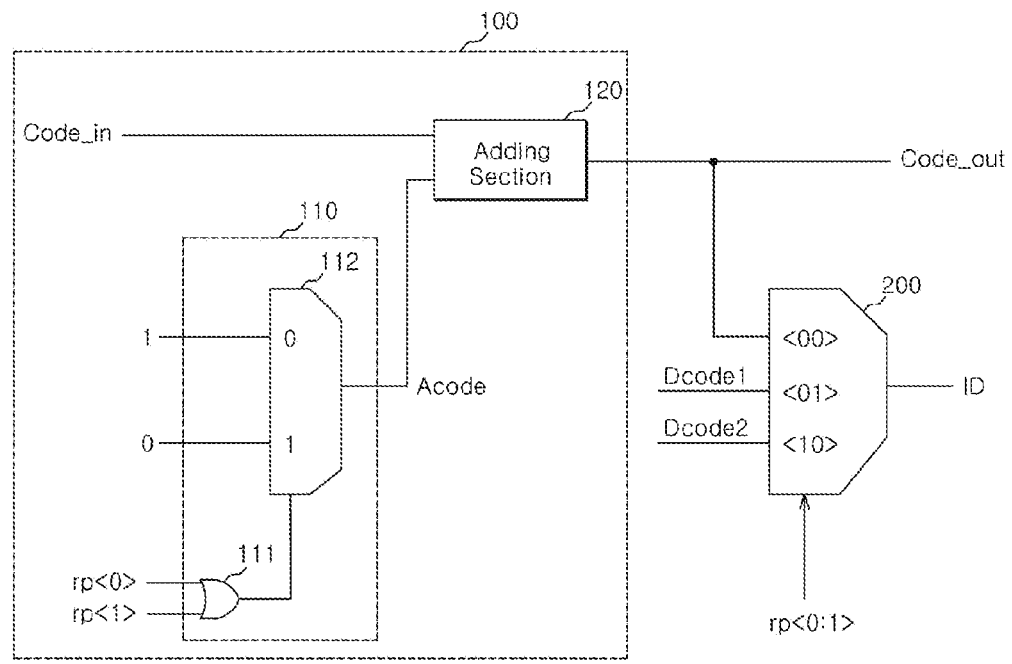
FIG. 4 is a schematic block diagram of a chip ID assignment circuit in accordance with another embodiment of the present invention.

FIG. 4 is a schematic block diagram of a chip ID assignment circuit in accordance with another embodiment of the present invention.

The chip ID assignment circuit shown in FIG. 4 is configured to employ the method for assigning chip IDs in a semiconductor apparatus shown in FIGS. 1 and 2. In a semiconductor apparatus including a plurality of chips, each chip of the semiconductor apparatus includes the chip ID assignment circuit shown in FIG. 4. A plurality of chip ID assignment circuits included in the plurality of chips have serial input/output relationships with respect to an operation code Ccode.

In order to clearly describe the input/output relationships of the chip ID assignment circuits with respect to the operation code Ccode, the operation code Ccode will be described by being divided into an input operation code Code_in which is inputted to the chip ID assignment circuit and an output operation code Code_out which is outputted from the chip ID assignment circuit.

Referring to FIG. 4, the chip ID assignment circuit may include an operation unit 100 and a chip ID selection unit 200.

The operation unit 100 is configured to generate the output operation code Code_out by adding 1 or not adding 1 to the input operation code Code_in according to a repair signal rp<0:1>.

The repair signal rp<0:1> is a signal which has the repair information of a corresponding chip. The repair signal rp<0:1> may be used as a signal which is recorded in a recording element (for example, an electrical fuse, a latch circuit, a flip-flop, and so on) included in the corresponding chip. The repair signal rp<0:1> shown in FIG. 4 is exemplified as a signal having 2 bits to correspond to the repair information shown in FIGS. 1 and 2.

Also, the repair signal rp<0:1> is exemplified in such a manner that it is recorded as <00> when a corresponding chip is a normal chip, as <01> when the corresponding chip is a first failed chip, and as <10> when the corresponding chip is a second failed chip.

As shown in FIG. 4, the operation unit 100 may include an adding code generation section 110 and an adding section 120.

The adding code generation section 110 is configured to generate an adding code Acode according to the repair signal rp<0:1>. The adding code generation section 110 may include an OR gate 111 and a MUX circuit 112.

The OR gate 111 receives and ORs the respective bits of the repair signal rp<0:1>. The MUX circuit 112 outputs one of 1 or 0 as the adding code Acode according to the output signal of the OR gate 111.

The adding section 120 is configured to add the input operation code Code_in and the adding code Acode and generate the output operation code Code_out. The adding section 120 may include an adder circuit which is generally known in the art.

As the adding code generation section 110 generates the adding code Acode as 0 or 1 according to the repair signal rp<0:1>, the operation unit 100 can perform an operation of generating the output operation code Code_out by adding or not adding 1 to the input operation code Code_in according to the repair signal rp<0:1>.

The chip ID selection unit 200 is configured to select the output operation code Code_out or the predetermined code Dcode1 or Dcode2 as a chip ID 'ID' according to the repair signal rp<0:1>. In the case of the chip ID assignment method shown in FIGS. 1 and 2, the chip ID selection unit 200 may select the output operation code Code_out as the chip ID 'ID' when the repair signal rp<0:1> is <00>, select the first predetermined code Dcode1 as the chip ID 'ID' when the repair signal rp<0:1> is <01>, and select the second predetermined code Dcode2 as the chip ID 'ID' when the repair signal rp<0:1> is <10>.

Figure 5:
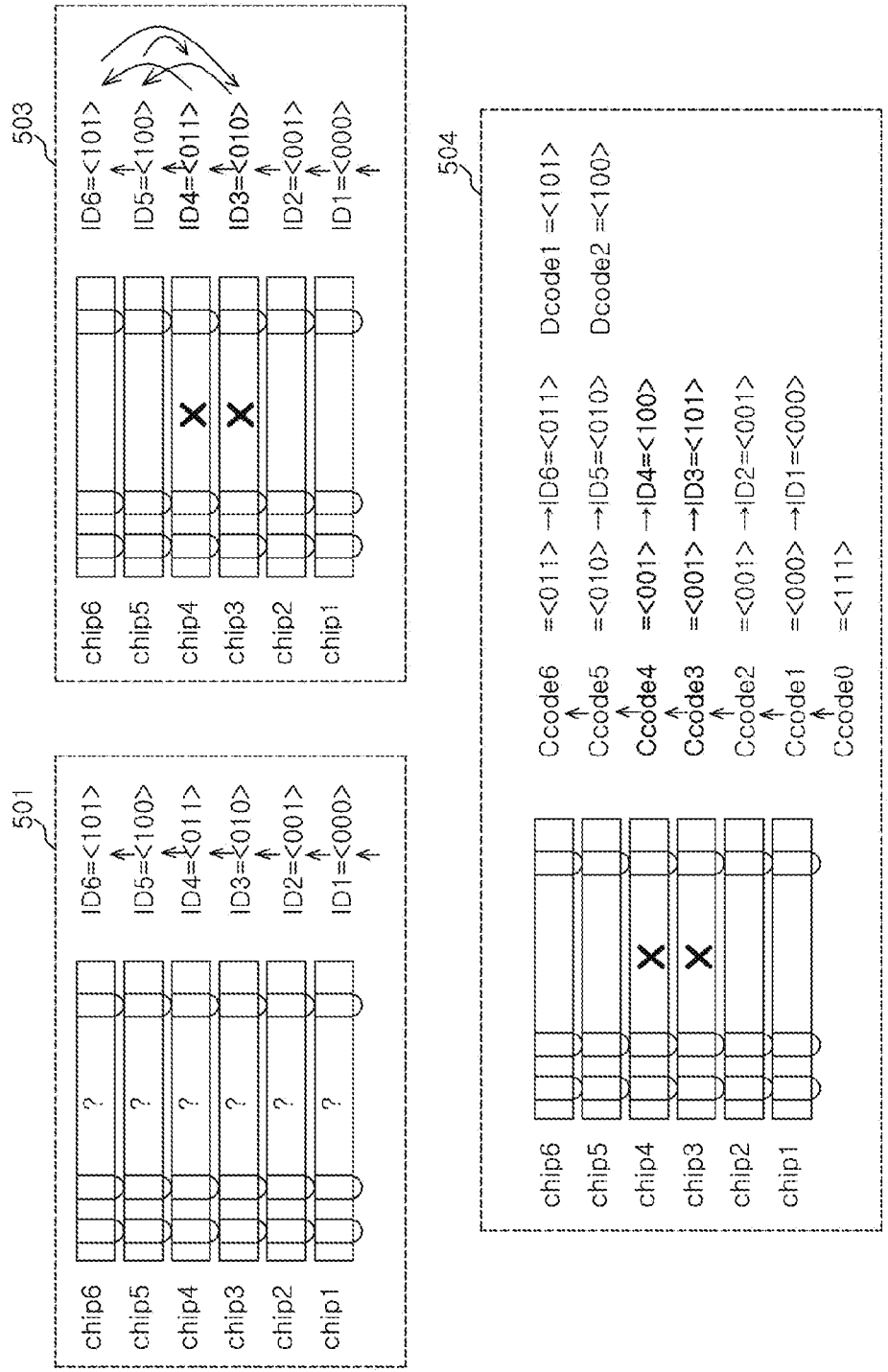
FIG. 5 is a schematic diagram showing a method for setting a semiconductor apparatus in accordance with another embodiment of the present invention.

FIG. 5 is a schematic diagram showing a method for setting a semiconductor apparatus in accordance with another embodiment of the present invention.

The method for setting a semiconductor apparatus shown in FIG. 5 includes the steps of assigning chip IDs for respective chips of the semiconductor apparatus which includes a plurality of chips (501), determining whether or not the respective chips are normal or failed (502), recording repair information in the respective chips according to whether the respective chips are normal or failed (503), and substituting chip IDs of normal chips and failed chips (504).

In a semiconductor memory apparatus including a plurality of chips which are stacked in a TSV type, in order to ensure easy manufacture of a semiconductor memory apparatus, a scheme (a pre-stacking scheme) is adopted, in which a stacking process is performed in advance before respective chips are individualized from a wafer.

The pre-stacking scheme is characterized in that whether or not respective chips are failed chips or normal chips is not confirmed after a stacking process is performed and, even when it can be confirmed, it is difficult to record repair information confirmed with the chips stacked in storage elements such as fuses.

The method for setting a semiconductor apparatus shown in FIG. 5 may be employed in a semiconductor apparatus which adopts such a pre-stacking scheme.

Among six chips chip1 through chip6 shown in FIG. 5, four chips chip1 through chip4 are normal chips, and two chips chip5 and chip6 are redundancy chips provided in preparation for the occurrence of a fail in the normal chips chip1 through chip4.

In FIG. 5, it is exemplified that the six chips chip1 through chip6 are configured in such a manner that the values of the chip IDs of failed chips are greater than those of the chip IDs of normal chips and the chip IDs of the normal chips consecutively increase. This configuration is presented as an example and may be changed according to a setting of a designer.

The step of assigning chip IDs for respective chips (501) may be implemented by using a general chip ID assignment scheme in which the chip IDs are assigned such that the chip IDs of the respective chips sequentially increase.

It is illustrated in FIG. 5 that, as the step of assigning chip IDs for respective chips (501) is implemented, chip IDs ID1 through ID6 are assigned to the six chips chip1 through chip6 such that the values of the chip IDs ID1 through ID6 increase consecutively from <000> to <101>.

The step of determining whether or not the respective chips are normal or failed (502) may be implemented by performing input/output tests, generally known in the art, for the six chips chip1 through chip6. Since the six chips chip1 through chip6 are assigned with the chip IDs ID1 through ID6, a controller (not shown) or a test equipment (not shown) may select each of the six chips chip1 through chip6. Accordingly, as the input/output tests are performed for the respective six chips chip1 through chip6, the controller or the test equipment can determine whether the respective chips chip1 through chip6 are normal or failed.

In the present embodiment, it is exemplified that, as the step of determining whether or not the respective chips are normal or failed (502) is implemented, the two chips chip3 and chip4 are determined as being failed.

The step of recording repair information in the respective chips according to whether the respective chips are normal or failed (503) may be implemented by recording the repair information in the storage elements (for example, electrical fuses, latch circuits, and the likes) included in the respective chips by using the controller or the test equipment. As described above, since the six chips chip1 through chip6 are assigned with the chip IDs ID1 through ID6, the controller or the test equipment may perform a desired operation by selecting each of the six chips chip1 through chip6.

In the semiconductor memory apparatus including the plurality of chips stacked in a TSV type, in order to implement the step of recording repair information in the respective chips according to whether the respective chips are normal or failed (503), the respective chips may be configured to include electrical fuses.

It is illustrated in FIG. 5 that, as the step of recording repair information in the respective chips according to whether the respective chips are normal or failed (503) is implemented, the repair information (marked with X) are recorded in the two chips chip3 and chip4. The repair information may be provided by repair signals of plural bits as shown in FIG. 4.

As described above, it is exemplified in FIG. 5 that the six chips chip1 through chip6 are configured in such a manner that the values of the chip IDs of failed chips are greater than those of the chip IDs of normal chips and the chip IDs of the normal chips consecutively increase. Therefore, as shown in FIG. 5, the chip IDs ID3 and ID4 of the chips chip3 and chip4 must be substituted with the chip IDs ID5 and ID6 of the chips chip5 and chip6.

The step of substituting chip IDs of normal chips and failed chips (504) may be implemented by re-assigning the chip IDs ID1 through ID6 of the plurality of chips such that the failed chips chip3 and chip4 have chip IDs with values greater than the normal chips chip1, chip2, chip5 and chip6. Accordingly, the step of substituting chip IDs of normal chips and failed chips (504) may be implemented by performing the chip ID assignment method in accordance with the embodiment of the present invention shown in FIG. 1. Since the embodiment of the present invention shown in FIG. 1 is stated above, detailed description thereof will be omitted herein.

It is illustrated in FIG. 5 that, as the step of substituting chip IDs of normal chips and failed chips (504) is implemented, among the six chips chip1 through chip6, the chip IDs ID3 and ID4 of <101> and <100> in the failed chips chip3 and chip4 are set to have values grater than the chip IDs ID1, ID2, ID5 and ID6 of <000>, <001>, <010> and <011> in the normal chips chip1, chip2, chip5 and chip6, and the chip IDs ID1, ID2, ID5 and ID6 of <000>, <001>, <010> and <011> in the normal chips chip1, chip2, chip5 and chip6 are set to consecutively increase.

In the embodiments described with reference to FIGS. 1 through 5, the plurality of chips chip1 through chip6 are divided into normal chips and failed chips, are classified by the repair information, and are assigned with the chip IDs ID1 through ID6 based on the repair information. This technical concept of the present invention may be applied to a method in which the chip IDs ID1 through ID6 are assigned differently according to the performances of the respective chips in the plurality of chips chip1 through chip6.

For example, it is assumed that all the six chips chip1 through chip6 shown in FIGS. 1 through 5 are normal chips. That is to say, all the respective chips chip1 through chip6 have repair information indicating normal chips. Thus, according to the method for assigning chip IDs in a semiconductor apparatus shown in FIGS. 1 through 5, the six chips chip1 through chip6 have the chip IDs ID1 through ID6 the values of which sequentially increase from <000> to <101>.

Here, since the controller (not shown) employing the semiconductor apparatus uses <000>, <001>, <010> and <011> as the chip selection codes, only the four chips chip1 through chip4 are selected and used among the six chips chip1 through chip6.

If the semiconductor apparatus including the six chips chip1 through chip6 is used for a long time, the performances of the four chips chip1 through chip4 may be degraded compared to the two chips chip5 and chip6. If not the two chips chip5 and chip6 but the four chips chip1 through chip4 are continually used under this situation, inefficiency may result.

Therefore, in order to solve this problem, a method for setting a semiconductor apparatus in accordance with another embodiment of the present invention may include the steps of assigning chip IDs for respective chips of the semiconductor apparatus which includes a plurality of chips (a), evaluating the performances of the respective chips (b), classifying the plurality of chips into a first group and a second group according to the performances of the respective chips and recording evaluation results in the respective chips (c), and re-assigning the chip IDs of the plurality of chips such that chip IDs of chips of the first group are consecutive (d).

In the method for setting a semiconductor apparatus, the steps (a), (b), (c) and (d) correspond to the aforementioned steps (501), (502), (503) and (504), respectively. Accordingly, detailed description of the steps (a), (b), (c) and (d) will be omitted herein.

If the method for setting a semiconductor apparatus in accordance with the embodiment of the present invention is employed, among the six chips chip1 through chip6, four chips with high performances may be classified into first group chips and two chips with low performances may be classified into second group chips, and chip IDs may be assigned to the first group chips such that the chip IDs of the first group chips are consecutive (for example, as <000>, <001>, <010> and <011>).

While certain embodiments have been described above, it will be understood to those skilled in the art that the embodiments described are by way of example only. Accordingly, the semiconductor apparatus, the method for assigning chip IDs thereof, and the method for setting the same described herein should not be limited based on the described embodiments. Rather, the semiconductor apparatus, the method for assigning chip IDs thereof, and the method for setting the same described herein should only be limited in light of the claims that follow when taken in conjunction with the above description and accompanying drawings.

What is claimed is:

1. A semiconductor apparatus including first and second chips, comprising:
    a first operation unit disposed in the first chip, and configured to perform a predetermined arithmetic operation for an initial code according to a first repair signal and generate a first operation code; and
    a second operation unit disposed in the second chip, and configured to perform the predetermined arithmetic operation for the first operation code according to a second repair signal and generate a second operation code.

2. The semiconductor apparatus according to claim 1, wherein the predetermined arithmetic operation is an operation of increasing a code value.

3. The semiconductor apparatus according to claim 1, wherein the predetermined arithmetic operation is an operation of decreasing a code value.

4. The semiconductor apparatus according to claim 1, wherein the first operation unit comprises:
    an adding code generation section configured to generate an adding code according to the first repair signal; and
    an adding section configured to add the initial code and the adding code and generate a first operation code.

5. The semiconductor apparatus according to claim 1, wherein the second operation unit comprises:
    an adding code generation section configured to generate an adding code according to the second repair signal; and
    an adding section configured to add the first operation code and the adding code and generate a second operation code.

6. The semiconductor apparatus according to claim 1, further comprising:
    a first chip ID selection unit disposed in the first chip, and configured to select the first operation code or a first predetermined code as a first chip ID according to the first repair signal; and
    a second chip ID selection unit disposed in the second chip, and configured to select the second operation code or a second predetermined code as a second chip ID according to the second repair signal.

7. The semiconductor apparatus according to claim 6, wherein the predetermined arithmetic operation is an operation of increasing a code value, and
    wherein the first chip ID selected as the first predetermined code has a value greater than that of the second chip ID selected as the second operation code.

8. The semiconductor apparatus according to claim 6, wherein the predetermined arithmetic operation is an operation of increasing a code value, and wherein the second chip ID selected as the second predetermined code has a value greater than that of the first chip ID selected as the first operation code.

9. The semiconductor apparatus according to claim 6, wherein the predetermined arithmetic operation is an operation of increasing a code value, and
wherein a greater value of the first predetermined code and the second predetermined code is greater than or equal to a greater value of the first operation code and the second operation code.

10. The semiconductor apparatus according to claim 6, wherein the predetermined arithmetic operation is an operation of decreasing a code value, and
wherein the first chip ID selected as the first predetermined code has a value less than that of the second chip ID selected as the second operation code.

11. The semiconductor apparatus according to claim 6, wherein the predetermined arithmetic operation is an operation of decreasing a code value, and
wherein the second chip ID selected as the second predetermined code has a value less than that of the first chip ID selected as the first operation code.

12. The semiconductor apparatus according to claim 6, wherein the predetermined arithmetic operation is an operation of decreasing a code value, and
wherein a less value of the first predetermined code and the second predetermined code is less than or equal to a less value of the first operation code and the second operation code.

13. The semiconductor apparatus according to claim 1, wherein the first repair signal and the second repair signal are signals which are recorded by electrical fuses.

14. The semiconductor apparatus according to claim 1, wherein the respective chips are connected in a TSV type.

15. A semiconductor apparatus including first and second chips, comprising:
the first chip configured to receive an initial code and generate a first operation code;
the second chip configured to receive the first operation code and generate a second operation code;
a first chip ID selection unit disposed in the first chip, and configured to select the first operation code or a first predetermined code as a first chip ID according to a first repair signal; and
a second chip ID selection unit disposed in the second chip, and configured to select the second operation code or a second predetermined code as a second chip ID according to a second repair signal.

16. The semiconductor apparatus according to claim 15, wherein the first chip ID and the second chip ID have different values.

17. The semiconductor apparatus according to claim 15, further comprising:
a first operation unit disposed in the first chip, and configured to perform a predetermined arithmetic operation for the initial code according to the first repair signal and generate the first operation code; and
a second operation unit disposed in the second chip, and configured to perform the predetermined arithmetic operation for the first operation code according to the second repair signal and generate the second operation code.

18. The semiconductor apparatus according to claim 17, wherein the predetermined arithmetic operation is an operation of increasing a code value, and wherein the first chip ID selected as the first predetermined code has a value greater than that of the second chip ID selected as the second operation code.

19. The semiconductor apparatus according to claim 17, wherein the predetermined arithmetic operation is an operation of decreasing a code value, and
wherein the first chip ID selected as the first predetermined code has a value less than that of the second chip ID selected as the second operation code.

20. The semiconductor apparatus according to claim 17, wherein the predetermined arithmetic operation is an operation of increasing a code value, and
wherein the second chip ID selected as the second predetermined code has a value greater than that of the first chip ID selected as the first operation code.

21. The semiconductor apparatus according to claim 17, wherein the predetermined arithmetic operation is an operation of decreasing a code value, and
wherein the second chip ID selected as the second predetermined code has a value less than that of the first chip ID selected as the first operation code.

22. The semiconductor apparatus according to claim 17, wherein the predetermined arithmetic operation is an operation of increasing a code value, and
wherein a greater value of the first predetermined code and the second predetermined code is greater than or equal to a greater value of the first operation code and the second operation code.

23. The semiconductor apparatus according to claim 17, wherein the predetermined arithmetic operation is an operation of decreasing a code value, and
wherein a less value of the first predetermined code and the second predetermined code is less than or equal to a less value of the first operation code and the second operation code.

24. The semiconductor apparatus according to claim 15, wherein the first repair signal and the second repair signal are signals which are recorded by electrical fuses.

25. The semiconductor apparatus according to claim 15, wherein the respective chips are connected in a TSV type.

26. A method for assigning chip IDs in a semiconductor apparatus including first and second chips, the method comprising the steps of:
inputting an initial code to the first chip;
generating a first operation code by performing a predetermined arithmetic operation for the initial code according a first repair information in the first chip;
assigning the first operation code or a first predetermined code as a first chip ID of the first chip according to the first repair information;
generating a second operation code by performing the predetermined arithmetic operation for the first operation code according a second repair information in the second chip; and
assigning the second operation code or a second predetermined code as a second chip ID of the second chip according to the second repair information.

27. The method according to claim 26, wherein the predetermined arithmetic operation is an operation of increasing a code value.

28. The method according to claim 27, wherein the step of generating the first operation code comprises the steps of:
generating an adding code according to the first repair information such that the first operation code has a value greater than that of the initial code; and
generating the first operation code by adding the initial code and the adding code.

29. The method according to claim 27, wherein the step of generating the second operation code comprises the steps of:
generating an adding code according to the second repair information such that the second operation code has a value greater than that of the first operation code; and
generating the second operation code by adding the first operation code and the adding code.

30. The method according to claim 27, wherein the first chip ID selected as the first predetermined code has a value greater than that of the second chip ID selected as the second operation code.

31. The method according to claim 27, wherein the second chip ID selected as the second predetermined code has a value greater than that of the first chip ID selected as the first operation code.

32. The method according to claim 27, wherein a greater value of the first predetermined code and the second predetermined code is greater than or equal to a greater value of the first operation code and the second operation code.

33. The method according to claim 26, wherein the predetermined arithmetic operation is an operation of decreasing a code value.

34. The method according to claim 33, wherein the step of generating the first operation code comprises the steps of:
generating an adding code according to the first repair information such that the first operation code has a value less than that of the initial code; and
generating the first operation code by adding the initial code and the adding code.

35. The method according to claim 33, wherein the step of generating the second operation code comprises the steps of:
generating an adding code according to the second repair information such that the second operation code has a value less than that of the first operation code; and
generating the second operation code by adding the first operation code and the adding code.

36. The method according to claim 33, wherein the first chip ID selected as the first predetermined code has a value less than that of the second chip ID selected as the second operation code.

37. The method according to claim 33, wherein the second chip ID selected as the second predetermined code has a value less than that of the first chip ID selected as the first operation code.

38. The method according to claim 33, wherein a greater value of the first predetermined code and the second predetermined code is less than or equal to a greater value of the first operation code and the second operation code.

39. The method according to claim 26, wherein the first chip ID and the second chip ID have different values.

40. The method according to claim 26, wherein the respective chips are connected in a TSV type.

41. The method according to claim 26, further comprising the step of:
recording the first and second repair information in the first and second chips, respectively.

42. The method according to claim 41, wherein the first and second repair information are respectively recorded in the first and second chips using electrical fuses which are included in the semiconductor apparatus.

43. A semiconductor apparatus comprising:
an operation unit configured to perform a predetermined arithmetic operation for an operation code according to a repair signal; and
a chip ID assignment circuit including a chip ID selection unit configured to select the operation code or a predetermined code as a chip ID according to the repair signal.

44. The semiconductor apparatus according to claim 43, wherein the operation unit comprises:
an adding code generation section configured to generate an adding code according to the repair signal; and
an adding section configured to add the operation code and the adding code.

45. The semiconductor apparatus according to claim 43, wherein the repair signal is recorded as an electrical fuse.

46. The semiconductor apparatus according to claim 43, wherein the predetermined arithmetic operation is an increment operation for the operation code.

47. The semiconductor apparatus according to claim 46, wherein the predetermined arithmetic operation is an operation of adding 1 to the operation code.

48. The semiconductor apparatus according to claim 46, wherein the predetermined code has a value greater than that of the operation code.

49. The semiconductor apparatus according to claim 43, wherein the predetermined arithmetic operation is a decrement operation for the operation code.

* * * * *